(12) United States Patent
Lee et al.

(10) Patent No.: US 8,780,572 B2
(45) Date of Patent: Jul. 15, 2014

(54) PRINTED CIRCUIT BOARD HAVING ELECTRONIC COMPONENT

(75) Inventors: Doo Hwan Lee, Uijeongbu-si (KR); Tae Sung Jeong, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 312 days.

(21) Appl. No.: 12/923,720

(22) Filed: Oct. 5, 2010

(65) Prior Publication Data

US 2011/0290546 A1    Dec. 1, 2011

(30) Foreign Application Priority Data

May 28, 2010    (KR) .................. 10-2010-0050511

(51) Int. Cl.
    *H05K 1/18*    (2006.01)
(52) U.S. Cl.
    USPC ........... 361/761; 361/763; 361/764; 361/766; 361/782; 174/259; 174/260
(58) Field of Classification Search
    USPC ................. 361/763–766, 803, 782–784, 793; 174/259–264
    See application file for complete search history.

(56) References Cited

U.S. PATENT DOCUMENTS

| | | | | |
|---|---|---|---|---|
| 6,876,554 | B1 * | 4/2005 | Inagaki et al. | 361/763 |
| 7,141,884 | B2 * | 11/2006 | Kojima et al. | 257/778 |
| 7,420,128 | B2 * | 9/2008 | Sunohara et al. | 174/260 |
| 7,653,991 | B2 * | 2/2010 | Mok et al. | 29/847 |
| 7,886,433 | B2 * | 2/2011 | Bae et al. | 29/846 |
| 2010/0006203 | A1 * | 1/2010 | Lee et al. | 156/60 |
| 2010/0103634 | A1 * | 4/2010 | Funaya et al. | 361/761 |
| 2011/0214913 | A1 * | 9/2011 | Lee et al. | 174/260 |

FOREIGN PATENT DOCUMENTS

| | | |
|---|---|---|
| JP | 2002-246757 | 8/2002 |
| JP | 2006-49424 | 2/2006 |
| JP | 2006-222334 | 8/2006 |
| JP | 2010-118373 | 5/2010 |
| KR | 10-2006-0049008 | 5/2006 |
| KR | 10-2007-0101183 | 10/2007 |
| KR | 10-2008-0046275 | 5/2008 |
| KR | 10-2008-0106977 | 12/2008 |
| WO | 2007/034629 | 3/2007 |

OTHER PUBLICATIONS

Japanese Office Action mailed May 15, 2012 issued in corresponding Japanese Patent Application No. 2010-255631.
Korean Office Action mailed Aug. 10, 2011 issued in corresponding Korean Patent Application No. 10-2010-0050511.
Korean Notice of Allowance mailed Nov. 9, 2011 issued in corresponding Korean Patent Application No. 10-2010-0050511.

* cited by examiner

*Primary Examiner* — Tuan T Dinh

(57) ABSTRACT

A printed circuit board that include: an electronic component having a plating electrode pad having a predetermined thickness; an insulating resin layer that exposes a lower surface of the electrode pad, receives the electronic component, and embodies the electronic component so that the center of the base body forming the electronic component is positioned at the center of the insulating resin layer; and circuit layers that include a circuit pattern disposed on the electrode pad, form inter-layer connection, and are disposed on both surfaces of the insulating resin layer, respectively, the plating electrode pad having a thickness that conforms to a thickness from an upper surface of the electronic component to an upper surface of the insulating resin.

3 Claims, 4 Drawing Sheets

PRINTED CIRCUIT BOARD HAVING ELECTRONIC COMPONENT

CROSS REFERENCE TO RELATED APPLICATION

This application claims the benefit of Korean Patent Application No. 10-2010-0050511, filed on May 28, 2010, entitled "Printed Circuit Board Having Electronic Component And Method For Manufacturing Thereof," which is hereby incorporated by reference in its entirety into this application.

BACKGROUND OF THE INVENTION

1. Technical Field

The present invention relates to a printed circuit board having an electronic component, and more particularly, to a printed circuit board having an electronic component that is received so that a center of an insulating resin layer conforms to a center of a base body and a method for manufacturing thereof.

2. Description of the Related Art

Generally, passive devices such as a capacitor or a resistor are formed on a surface of a printed circuit board for a package. However, as the size of an electronic component becomes smaller and smaller and the integration thereof becomes higher and higher, the surface area of the printed circuit board is being reduced and the number of electronic components mounted on the surface of the printed circuit board is being increased. As a result, it is very difficult to mount the electronic component on the surface of the printed circuit board.

Therefore, a technology of a printed circuit board that can be miniaturized and highly integrated by embedding an electronic component into an insulating resin layer has been in the limelight.

In the related art, a method to implement the printed circuit board having an electronic component may be generally classified by an interconnection method between the electronic component and the circuit layer. As a representative method, after the electronic component and the circuit layer are interconnected with each other by flip chip bonding or solder mounting, the electronic component is embedded into the insulating resin layer having a cavity or the cavity is embedded in the insulating resin layer, the electronic component is fixed into the cavity, a build-up process including a laser processing process and a plating process is performed on the electronic component such that the electronic component may be interconnected with the circuit layer.

However, when the interconnection is made by the flip chip bonding, an additional process such as an underfill process, or the like, should be performed and bumps or posts should be previously formed in the electronic component. As a result, the process is complicated. In addition, when the electronic component is fixed to the cavity and then, the build-up process is performed, the bump included in the electronic component should be spaced away from each other by a pitch, which is required in the laser process. Therefore, for the interconnection, an inter-electrode pitch of the electronic component should be expanded. To this end, since a separate redistribution layer should be formed, there is a limitation in forming a fine pitch.

Therefore, the process of forming the printed circuit board having an electronic component is complicated, such that the yield is degraded, the manufacturing cost is increased, and it is difficult to form the fine pitch.

Further, the printed circuit board having the electronic component according to the related art adopts a structure in which the electronic component is embedded in only one side of the core substrate or in only one side of the build-up layer, it is highly like to have an asymmetrical structure that is vulnerable to a warpage phenomenon under a thermal stress environment. Therefore, since the warpage phenomenon is applied to the board in a direction in which the electronic component is positioned under a thermal stress environment, it is impossible to embed the electronic component having a predetermined thickness or less.

SUMMARY OF THE INVENTION

The present invention relates to a printed circuit board having an electronic component. An object of the present invention is to provide a printed circuit board having an electronic component capable of embedding components while minimizing a warpage phenomenon of the board by receiving the electronic component at a center of an insulating resin layer, even though an inter-electrode pitch is very small.

According to an exemplary embodiment of the present invention, there is provided a printed circuit board having an electronic component, including: an electronic component having a plating electrode pad having a predetermined thickness; an insulating resin layer that exposes a lower surface of the plating electrode pad and embodies the electronic component so that the center of the base body forming the electronic component is positioned at the center of the insulating resin layer; and circuit layers that include a circuit pattern disposed on the electrode pad, form inter-layer connection, and are disposed on both surfaces of the insulating resin layer, respectively.

The predetermined thickness may be in the range of 5 to 250 µm.

The insulating resin layer may be formed in a single layer.

The printed circuit board having an electronic further includes a core layer including a cavity corresponding to the electronic component, wherein the insulating resin layer is filled in the cavity of the core layer and is disposed on the core layer.

The insulating resin layer may be made of thermosetting resin.

The electronic component may be an active device including a body, a circuit layer formed on the body, and an insulating layer and the center of the insulating resin layer may conform to the center of the body of the electronic component.

According to another exemplary embodiment of the present invention, there is provided a method for manufacturing a printed circuit board having an electronic component, including: providing an adhesive member; attaching the electronic component including a plating electrode pad having a predetermined thickness on the adhesive member; heating and pressing an insulating sheet on the adhesive member including the electronic component to form an insulating resin layer so that the center of the base body forming the electronic component conforms to the center of the insulating resin layer; removing the adhesive member from the insulating resin layer having the electronic component; and forming circuit layers that include a circuit pattern disposed on the electrode pad, form inter-layer connection, and are disposed on both surfaces of the insulating resin layer, respectively.

The insulating sheet may be made of thermosetting resin.

The predetermined thickness may be in the range of 5 to 250 µm.

According to another exemplary embodiment of the present invention, there is provided a method for manufacturing a printed circuit board having an electronic component, including: providing an adhesive member; attaching the electronic component on the adhesive member; attaching a core layer having a cavity corresponding to the electronic component on the adhesive member; heating and pressing an insulating sheet on the core layer including the electronic component to form an insulating resin layer so that the center of the base body forming the electronic component conforms to the center of the insulating resin layer; removing the adhesive member from the core layer including the insulating resin layer; and forming circuit layers that include a circuit pattern disposed on the electrode pad, form inter-layer connection, and are disposed on both surfaces of the insulating resin layer, respectively.

The insulating sheet may be made of thermosetting resin.

The predetermined thickness may be in the range of 5 to 250 μm.

The core layer may be an unclad member.

DESCRIPTION OF THE PREFERRED EMBODIMENTS

Figure 1:
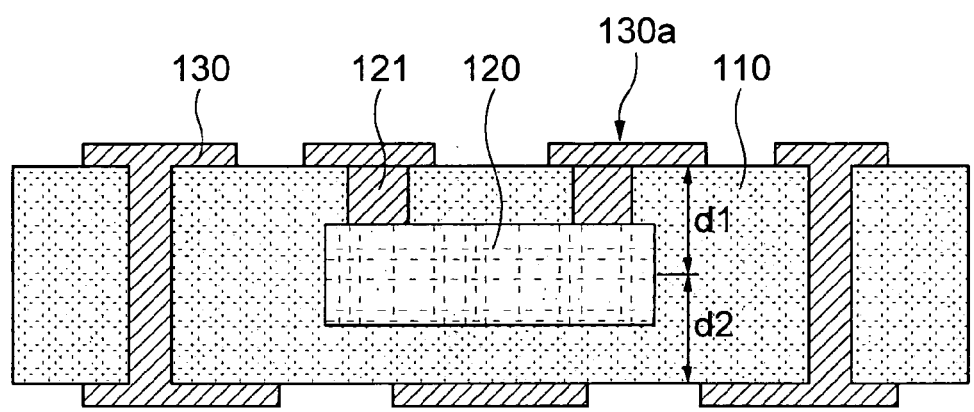
FIG. 1 is a cross-sectional view of a printed circuit board having an electronic component according to a first embodiment of the present invention.

Hereinafter, a printed circuit board having an electronic component according to the exemplary embodiments of the present invention will be described in detail with reference to the accompanying drawings. The exemplary embodiments of the present invention to be described below are provided by way of example so that the idea of the present invention can be sufficiently transferred to those skilled in the art to which the present invention pertains. Therefore, the present invention may be modified in many different forms and it should not be limited to the embodiments set forth herein. In the drawings, the size and the thickness of the apparatus may be exaggerated for the convenience. Like reference numerals denote like elements throughout the specification.

FIG. 1 is a cross-sectional view of a printed circuit board having an electronic component according to a first embodiment of the present invention.

Referring to FIG. 1, a printed circuit board having an electronic component according to a first embodiment of the present invention may be configured to include an electronic component 120, an insulating resin layer 110 having the electronic component 120, and a circuit layer 130 electrically connected to the electronic component 120.

The electronic component 120 may include a plating electrode pad 121 that is disposed on a base body forming the electronic component 120 and has a predetermined thickness. The predetermined thickness may preferably be in a range of 5 to 250 μm, more preferably, 10 to 20 μm. As described above, since the plating electrode pad 121 of the electronic component 120 has a predetermined thickness, the electronic component 120 may be directly electrically connected with the circuit layer 130 through the plating electrode pad 121 while being disposed at the center of the insulating resin layer 110.

A distance d1 from the center of the electronic component 120 to the upper surface thereof is the same as a distance d2 from the center of the electronic component 120 to the lower surface of the insulating resin layer 110. In other words, the printed circuit board having the electronic component may have an upper and lower symmetrical structure based on the center of the electronic component 120, such that a warpage defect of the printed circuit board having the electronic component can be prevented under a thermal stress environment. In this case, the insulating resin layer 110 may be formed in a single layer.

Although not shown in detail in FIG. 1, in order to form the plating electrode pad 121 of the electronic component 120, the insulating layer and the plating are repeatedly formed on the base body of the electronic component several times. Therefore, the thickness of the electronic component described in the present invention may partially include the thickness of the insulating layer. In this case, the symmetrical structure in the thickness direction of the electronic component means a symmetry corresponding to the thickness of the base body of the electronic component other than the thickness of the additionally included insulating layer. In other words, it may have a structure in which the center of the insulating resin layer 110 conforms to the center of the base body forming the electronic component 120.

An example of the electronic component 120 may include active devices such as a semiconductor chip, or the like, and passive devices such as a capacitor, inductor, resistor, or the like.

Herein, when the electronic component 120 is an active device, it may have a body, an insulating layer and a circuit layer formed on the body, etc. In this case, it is preferably designed so that the center of the body forming the electronic component 120 other than the insulating layer and the circuit layer conforms to the center of the insulating resin layer 110.

The thickness of the plating electrode pad 121 may conform to the thickness from the upper surface of the electronic component 120 to the upper surface of the insulating resin layer 110. Therefore, the upper surface of the plating electrode pad 121 included in the electronic component 120 may be exposed from the insulating resin layer 110.

The circuit layers 130 may form an inter-layer connection and be disposed at the upper and lower surfaces of the insulating resin layer 110, respectively. In this case, the circuit layer 130 may be disposed on the plating electrode pad 121 and includes a circuit pattern 130a connected to the plating electrode pad 121. Therefore, the electronic component 120 may be interconnected with the circuit layer 130 through the plating electrode pad 121 having a predetermined thickness and disposed at the center of the insulating resin layer 110.

The insulating resin layer 110 may be formed of a thermosetting resin. An example of a material forming the insulating resin layer 110 may include a prepreg resin, epoxy-based resin, polyimide-based resin, etc.

Therefore, as described in the embodiment of the present invention, in the printed circuit board having the electronic component, the electronic component is disposed at the center thereof, thereby making it possible to prevent a warpage defect caused by thermal stress.

In addition, the printed circuit board having the electronic component is interconnected with the circuit layer through the plating electrode pad included in the electronic component, such that the fine pitch can be achieved.

Figure 2:
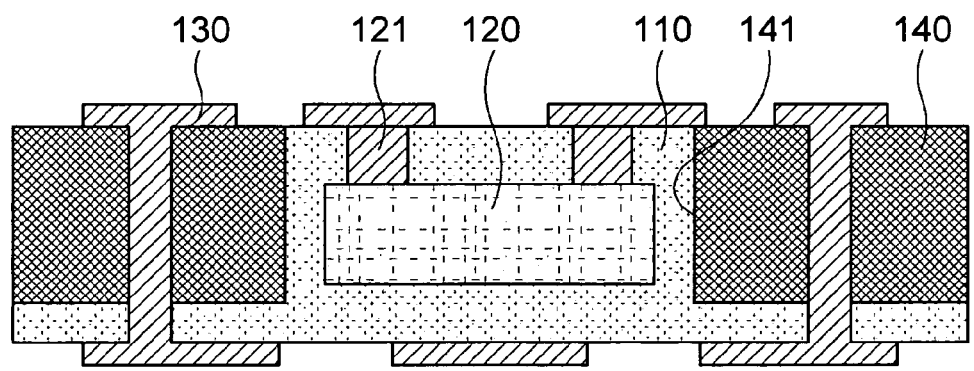
FIG. 2 is a cross-sectional view of a printed circuit board having an electronic component according to a second embodiment of the present invention.

FIG. 2 is a cross-sectional view of a printed circuit board having electronic components according to a second embodiment of the present invention. Herein, the second embodiment of the present invention has the same technical components as the printed circuit board having the electronic component according to the above-mentioned first embodiment, other than including the core layer. Like technical components are denoted by like reference numerals.

Referring to FIG. 2, the printed circuit board having the electronic component according to the second embodiment of the present invention may be configured to include the electronic component 120 including the plating electrode pad 121 having a predetermined thickness and the circuit layers 130 that expose the lower surface of the plating electrode pad 121 and are connected to the insulating resin layer 110 having the electronic component 120 at the center thereof and the plating electrode pad 121 and are disposed on both surfaces of the insulating resin layer 110, respectively.

Herein, a core layer 140 may be disposed in the insulating resin layer 110. The core layer 140 may be formed of an unclad member. In this case, the unclad member may include a B-stage resin or a C-stage resin.

The core layer 140 may include a cavity 141 corresponding to the electronic component 120. In other words, the electronic component 120 may be disposed in the cavity 141. In this case, the insulating resin layer 110 may be filled in the cavity 141 and may be disposed on the upper surface of the core layer 140.

As described in the embodiment of the present invention, the printed circuit board having the electronic component includes the core layer as a reinforcing member, thereby making it possible to increase the mechanical strength and durability of the printed circuit board having the electronic component.

FIGS. 3 to 6 are cross-sectional views explaining a method for manufacturing a printed circuit board having electronic components according to a third embodiment of the present invention.

Figure 3:
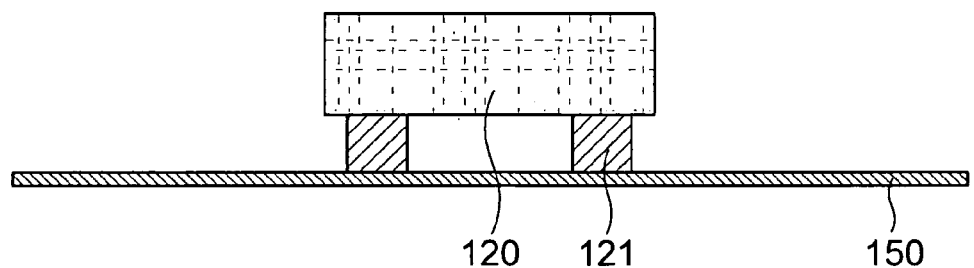
FIGS. 3 to 6 are cross-sectional views explaining a method for manufacturing a printed circuit board having an electronic component according to a third embodiment of the present invention.

Referring to FIG. 3, in order to manufacture the printed circuit board having the electronic component, an adhesive member 150 is first provided. The adhesive member 150 may have a tape form or a film form.

Herein, the adhesive member 150 may serve to protect the lower surface of the plating electrode pad 121 included in the electronic component 120 from being polluted by the insulating resin, while fixing the electronic component 120 to be described below.

The electronic component 120 is attached to the adhesive member 150. In this case, the electrode pad 121 is attached to the adhesive member 150.

Herein, the electronic component 120 may have the plating electrode pad 121 having a predetermined thickness. In this case, the plating electrode pad 121 may be formed on the base body forming the electronic component 120 through the plating process at a predetermined thickness.

The thickness of the plating electrode pad 121 may be in a range of 5 to 250 μm. When the thickness of the electrode pad 121 is 5 μm or less, the thickness of the insulating resin layer 110 covering the electronic component 120 is too small, such that it cannot perform a role as an insulator. The reason is that the thickness of the plating electrode pad 121 is the same as the thickness of the insulating resin layer 110 covering the electronic component 120. In addition, when the thickness of the plating electrode pad 121 exceeds 25 μm, it is difficult to sufficiently supply the insulating resin at the pitch between the electronic component 120 and the adhesive member 150 depending on the thickness of the plating electrode pad 121 in the subsequent process. Due to limitations in resin flowability of the insulating resin for forming the insulating resin layer 110, it is difficult to sufficiently supply the insulating resin between the adhesive member 150 and the electronic component 120. In addition, there is a problem in that the plating process time and cost are increased in order to form the plating electrode pad 121. More preferably, the thickness of the plating electrode pad 121 may be in a range of 10 to 20 μm.

Figure 4:
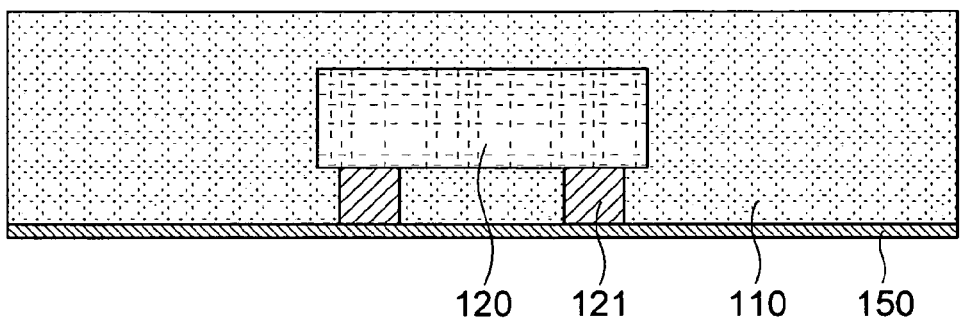

Referring to FIG. 4, an insulating sheet is heated and pressed on the adhesive member 150 to which the electronic component 120 is attached, thereby forming the insulating resin layer 110 receiving the electronic component. The insulating sheet, which is a supply source of the insulating resin for forming the insulating layer, may be made of thermosetting resin. An example of the thermosetting resin may include prepreg resin, epoxy-based resin, polyimide-based resin, or the like.

Thereafter, when the insulting sheet is heated at a glass transition temperature or more, it has flowability and is filled between the electronic component 120 and the adhesive member 150 and embedded in the electronic component 120. In this case, when heat applied to the insulating sheet having flowability is lowered at the glass transition temperature or less, the insulating sheet having flowability is cured, such that the insulating resin layer 110 having the electronic component 120 can be formed so that the center thereof conforms to the center of the electronic component, that is, the base body forming the electronic component 120.

Figure 5:
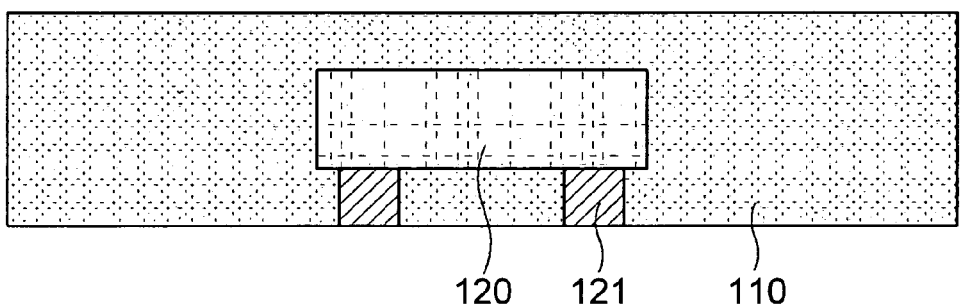

Referring to FIG. 5, the adhesive member 150 is removed from the insulating resin layer 110 having the electronic component 120. In this case, the plating electrode pad 121 attached to the adhesive member 150 may be naturally exposed to the outside. In this configuration, the plating electrode pad 121 is protected by the adhesive member 150 during the process of forming the insulating resin layer 110, thereby making it possible to prevent the plating electrode pad 121 from being polluted due to the insulating resin forming the insulating resin layer 110.

Therefore, the electronic component 120 is embedded in the insulating resin layer 110, but the plating electrode pad 121 may be exposed on the lower surface of the insulating resin layer 110 by naturally penetrating through the insulating resin layer 110.

In addition to this, after the adhesive member 150 is removed, components of the adhesive member may remain in the insulating resin layer 110. Therefore, a process of cleaning the insulating resin layer 110 having the electronic component 120 may be further provided.

Figure 6:
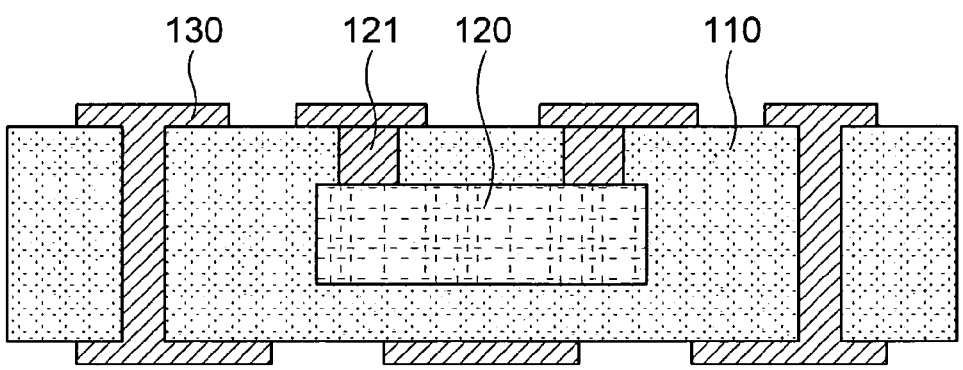

Referring to FIG. 6, the circuit layers 130 may be formed on both surfaces of the insulating resin layer 110, respectively. In order to form the circuit layer 130, via holes penetrating through the insulating resin layer 110 may be formed.

Thereafter, after the conductive layers are formed on both surfaces of the insulating resin layer 110 including the via hole and the plating electrode pad 121, respectively, the circuit layers 130 may be formed on both surfaces of the insulating resin layer, respectively, by etching the conductive layer. In this case, the circuit layer 130 may be disposed on the plating electrode pad 121 exposed from the insulating resin layer 110 and may include the electrically connected circuit pattern.

Therefore, the circuit layer 130 and the electronic component 120 are connected to each other through the plating electrode pad 121 having a predetermined thickness, such that they are electrically connected to each other. Thereby, the build-up process including the laser processing and plating processes to electrically connect the circuit layer 130 to the electronic component 120 may be omitted.

Therefore, in the printed circuit board having the electronic component of the present invention, the electronic component is embedded in the insulating resin layer and the interconnection is made through the electrode pad plated and formed on the base body of the electronic component at the predetermined thickness, such that the process can be simplified and the fine pitch can be achieved without performing the build-up process or the underfill process.

Further, the printed circuit board having the electronic components according to the present invention can be embedded so that the center of the insulating resin layer conforms to the center of the base body forming the electronic component, thereby preventing a warpage phenomenon of the board due to the thermal stress.

FIGS. 7 to 11 are cross-sectional views explaining a method for manufacturing a printed circuit board having electronic components according to a fourth embodiment of the present invention. The fourth embodiment can manufacture the printed circuit board having the electronic component by the same manufacturing method as the above-mentioned third embodiment, except that the core layer is further formed. Therefore, the repeated description with the third embodiment will be omitted and therefore, like components will be denoted by like reference numerals.

Figure 7:
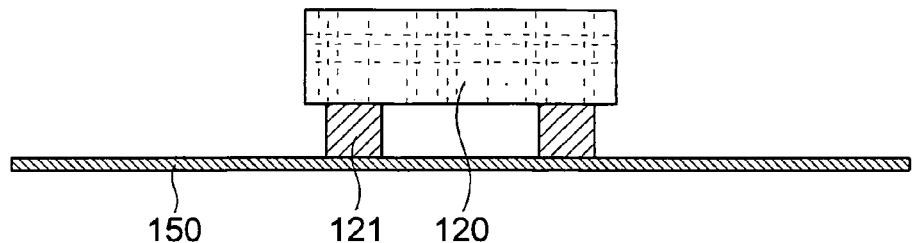
FIGS. 7 to 11 are cross-sectional views explaining a method for manufacturing a printed circuit board having an electronic component according to a fourth embodiment of the present invention.

Referring to FIG. 7, in order to manufacture the printed circuit board having the electronic component, the electronic component 120 is first attached on the adhesive member 150. In this case, the plating electrode pad 121 included in the electronic component 120 is attached on the adhesive member 150.

Figure 8:
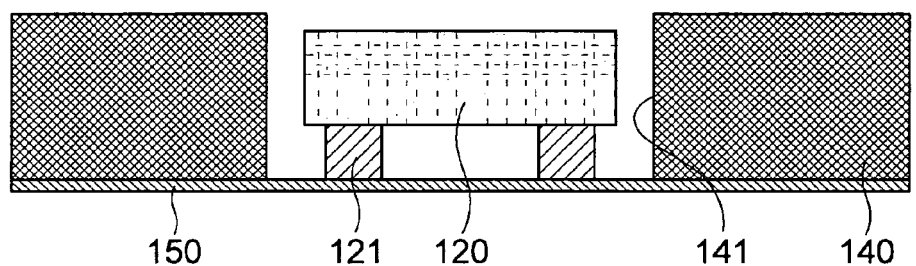

Referring to FIG. 8, the core layer 140 is attached on the adhesive member 150 to which the electronic component 120 is attached. In this case, the core layer 140 may include a cavity 141 corresponding to the electronic component 120. That is, the electronic component 120 may be received in the cavity 141 and may be attached on the adhesive member 150.

In this configuration, the cavity 141 of the core layer 140 may be formed by a laser or mechanical drill. The embodiment of the present invention is not limited to the process of forming the cavity 141 of the core layer 140.

The core layer 140 may be formed of the unclad member including the B-stage resin or the C-stage resin.

Figure 9:
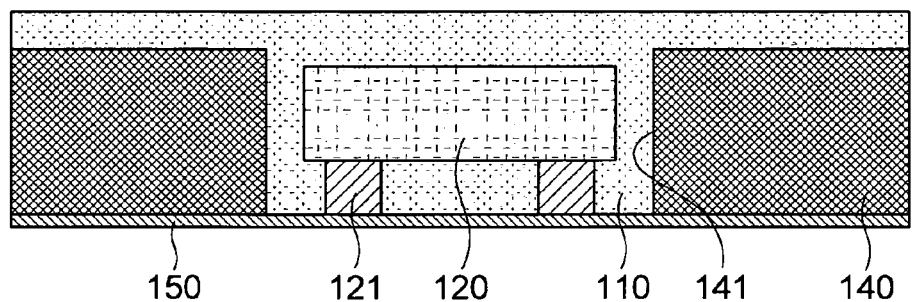

Referring to FIG. 9, the insulating resin layer 110 is formed on the core layer 140 including the cavity 141. In order to form the insulating resin layer 110, the insulating sheet is heated and pressed on the core layer 140 including the cavity 141. In this configuration, the insulating sheet has flowability and may be filled in the cavity 141 and between the adhesive member 150 and the electronic component 120 and disposed on the core layer.

Figure 10:
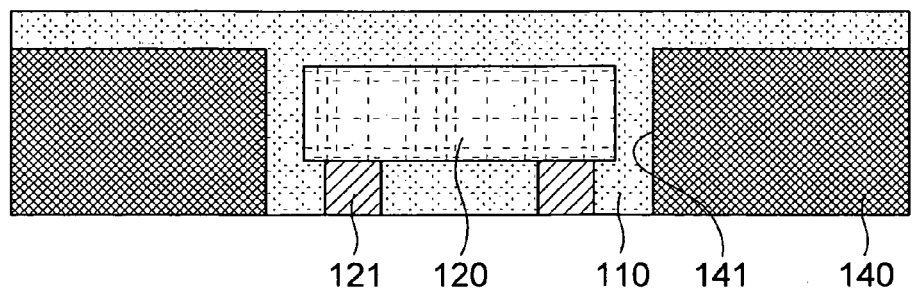
Figure 11:
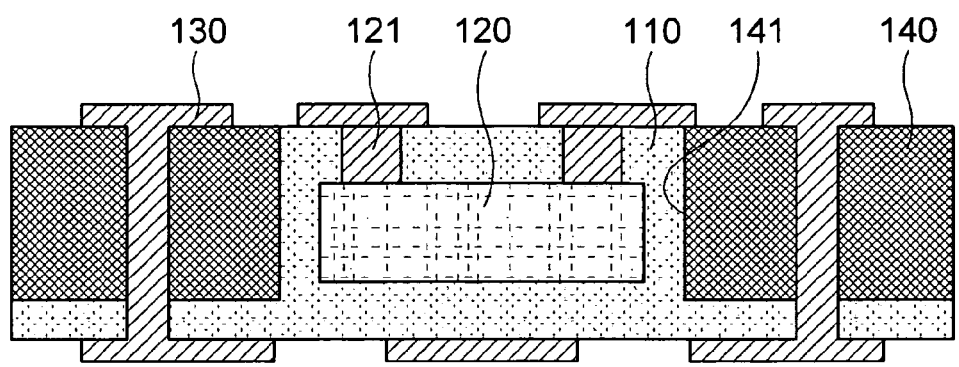

The adhesive member 150 is removed from the core layer 140 including the insulating resin layer 110 as shown in FIG. 10 and then, is disposed on both surfaces of the insulating resin layer 110 as shown in FIG. 11 and the circuit layer 130 electrically connected to the electronic component is formed, thereby making it possible to manufacture the printed circuit board having the electronic component so that the center of the base body forming the electronic component conforms to the center of the insulating resin layer.

Therefore, as in the embodiment of the present invention, the core layer including the cavity is formed in the insulating resin layer, thereby making it possible to secure the durability of the printed circuit board having the electronic component.

According to the present invention, in the printed circuit board having an electronic component, the manufacturing process can be simplified and the fine pitch can be achieved, by embodying the electronic component into the insulating resin layer and making the interconnection using the plating electrode having a predetermined thickness included in the electronic component.

Further, according to the present invention, in the printed circuit board having the electronic component received so that the center of the insulating resin layer conforms to the center of the base body of the electronic component, the warpage phenomenon of the board can be prevented under the thermal stress.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

Accordingly, such modifications, additions and substitutions should also be understood to fall within the scope of the present invention.

What is claimed is:

1. A printed circuit board comprising:
    an electronic component having a plating electrode pad having a predetermined thickness;
    an insulating resin layer formed in a single layer, exposing a surface of the plating electrode pad, and embodying the electronic component; and
    a circuit layer formed on a surface of the insulating resin layer,
    the plating electrode pad having a thickness that conforms to a thickness from a surface of the electronic component to a surface of the insulating resin, and
    the plating electrode pad connecting the electronic component with the circuit layer directly and electrically,
    the electronic component being an active device including a body, a circuit layer formed on the body, and an insulating layer, and
    a center of the insulating resin layer substantially conforming to a center of the body of the electronic component.

2. The printed circuit board according to claim 1, wherein the predetermined thickness is in the range of 5 to 250 μm.

3. The printed circuit board according to claim 1, wherein the insulating resin layer is made of thermosetting resin.

* * * * *